(12) United States Patent
Ohguro

(10) Patent No.: US 8,823,101 B2
(45) Date of Patent: Sep. 2, 2014

(54) ESD PROTECTION SEMICONDUCTOR DEVICE HAVING AN INSULATED-GATE FIELD-EFFECT TRANSISTOR

(75) Inventor: Tatsuya Ohguro, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 985 days.

(21) Appl. No.: 12/341,906

(22) Filed: Dec. 22, 2008

(65) Prior Publication Data
US 2009/0174000 A1   Jul. 9, 2009

(30) Foreign Application Priority Data
Dec. 26, 2007   (JP) ................. 2007-334738

(51) Int. Cl.
 H01L 29/78   (2006.01)
 H01L 23/00   (2006.01)
 H01L 29/66   (2006.01)
 H01L 27/02   (2006.01)

(52) U.S. Cl.
 CPC ....... H01L 24/06 (2013.01); H01L 2924/01006 (2013.01); H01L 2224/85399 (2013.01); H01L 2924/05042 (2013.01); H01L 2924/14 (2013.01); H01L 2224/04042 (2013.01); H01L 24/48 (2013.01); H01L 2924/01028 (2013.01); H01L 24/05 (2013.01); H01L 2924/13091 (2013.01); H01L 2924/01033 (2013.01); H01L 29/66818 (2013.01); H01L 2924/01005 (2013.01); H01L 2924/00014 (2013.01); H01L 2924/01083 (2013.01); H01L 27/0248 (2013.01); H01L 2924/01074 (2013.01); H01L 2224/05556 (2013.01); H01L 2224/48463 (2013.01); H01L 2924/01015 (2013.01); H01L 2924/01078 (2013.01); H01L 2224/05553 (2013.01); H01L 2924/30105 (2013.01); H01L 2924/01004 (2013.01); H01L 2224/05599 (2013.01); H01L 29/785 (2013.01); H01L 2924/01014 (2013.01)
 USPC ...................................................... 257/347

(58) Field of Classification Search
 USPC .......... 257/331, 347, 401, E27.062, E27.112, 257/E29.137
 See application file for complete search history.

(56) References Cited

U.S. PATENT DOCUMENTS

| 5,892,262 | A  | * | 4/1999 | Wu et al. ................. 257/356 |
| 2002/0163021 | A1 | * | 11/2002 | Robb et al. ............... 257/273 |
| 2003/0202307 | A1 |   | 10/2003 | Hung et al. |
| 2004/0110331 | A1 | * | 6/2004 | Yeo et al. ................ 438/199 |
| 2007/0025034 | A1 | * | 2/2007 | Chaudhary et al. .......... 361/56 |
| 2007/0040221 | A1 |   | 2/2007 | Gossner et al. |
| 2007/0090414 | A1 |   | 4/2007 | Sutou et al. |

FOREIGN PATENT DOCUMENTS

JP   2007-053316   3/2007

* cited by examiner

Primary Examiner — Thomas L Dickey
(74) Attorney, Agent, or Firm — White & Case LLP

(57) ABSTRACT

Fins of semiconductor are formed on the substrate. Each of the fins is located separately from one another. A gate insulating film is formed on side surfaces of the fins. A gate electrode is formed on the gate insulating film. The gate electrode extends to cross over the fins. A gate contact portion is provided to supply an electric signal. In the fins, first drain regions and first source regions are formed respectively so as to sandwich portions of the fins located below the gate electrode. A width of first one of the fins is larger than that of second one of the fins which is more distant from the gate contact portion than the first one of the fins.

14 Claims, 12 Drawing Sheets

Vth1=Vth2>Vth3=Vth4=Vth5=Vth6
W1=W2=W3=W4=W5=W6

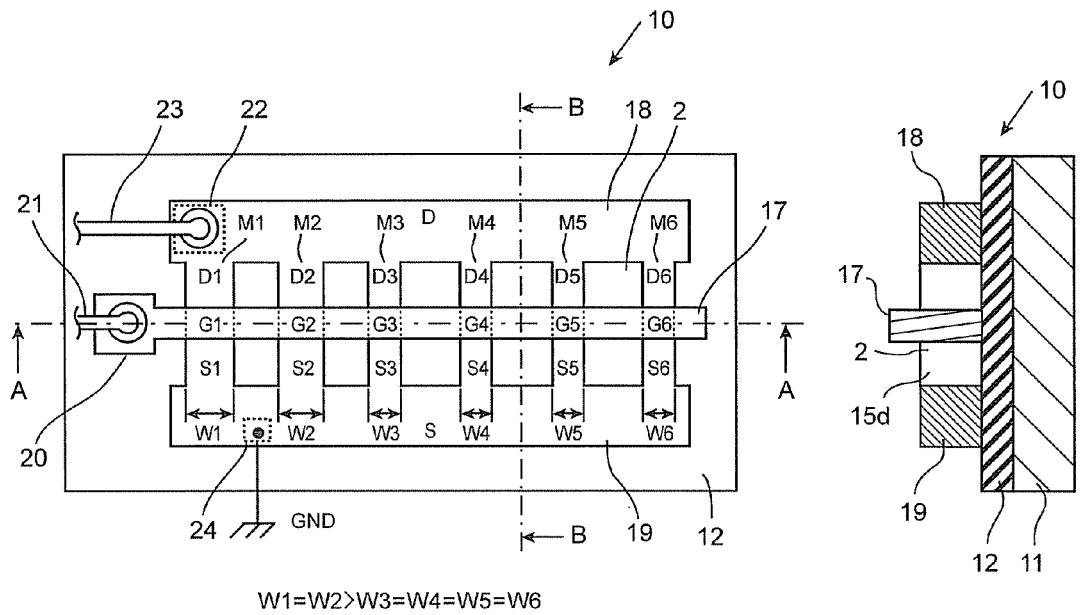
FIG. 1A
FIG. 1C
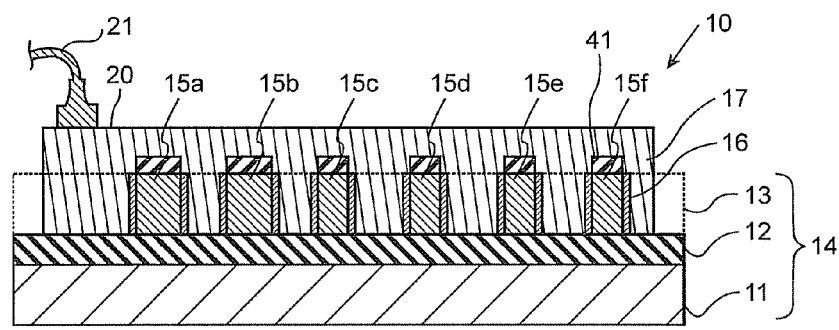
FIG. 1B

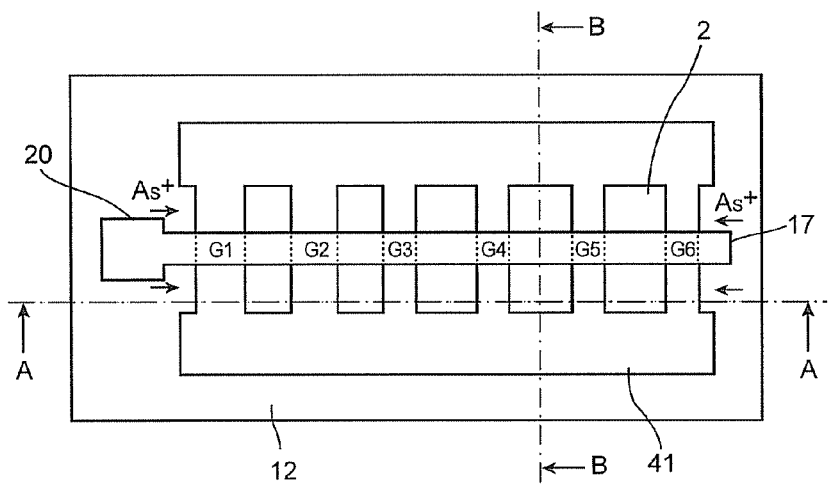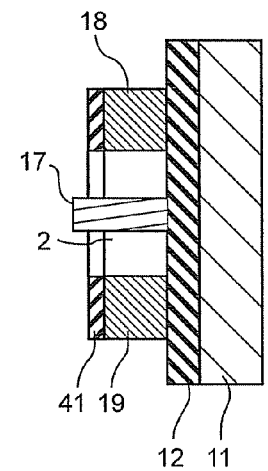
FIG. 6A  FIG. 6C
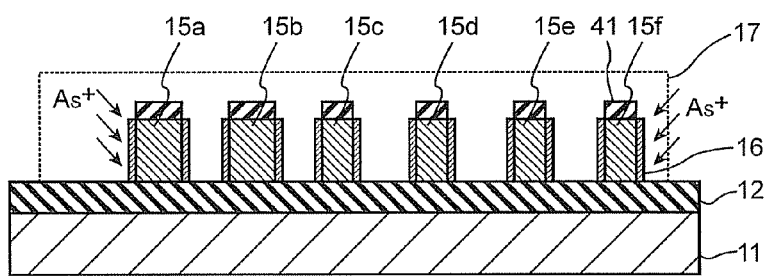
FIG. 6B

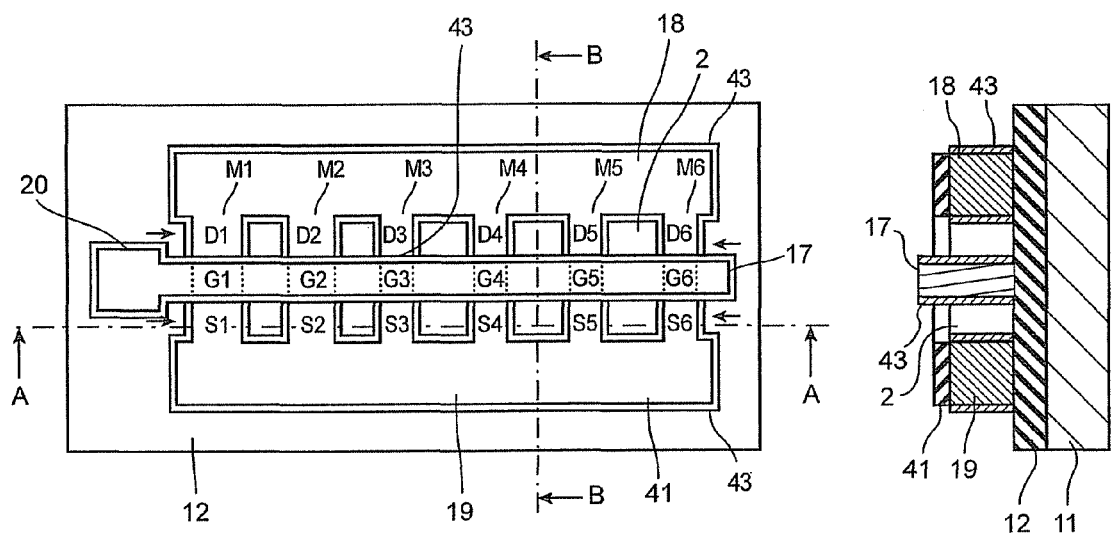
FIG. 7A
FIG. 7C
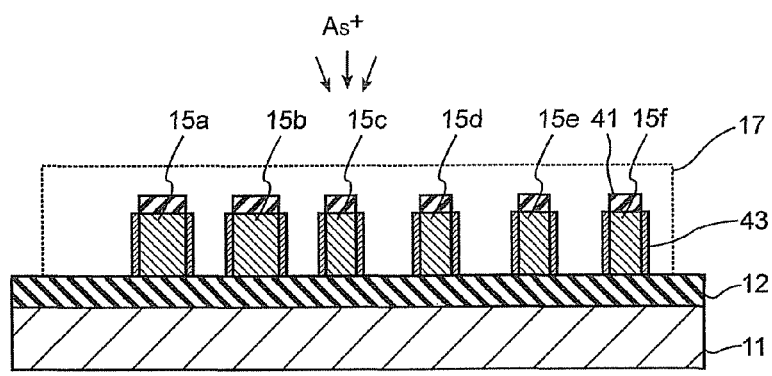
FIG. 7B

W1=W4>W1=W2=W5=W6

Vth1=Vth2>Vth3=Vth4=Vth5=Vth6
W1=W2=W3=W4=W5=W6

Vth1=Vth2>Vth3=Vth4=Vth5=Vth6
W1=W2>W3=W4=W5=W6

ESD PROTECTION SEMICONDUCTOR DEVICE HAVING AN INSULATED-GATE FIELD-EFFECT TRANSISTOR

CROSS REFERENCE TO RELATED APPLICATION

This application is based upon and claims the benefit of priority from the prior Japanese Patent Application No. 2007-334738, filed on Dec. 26, 2007, the entire contents of which are incorporated herein by reference.

BACKGROUND

A semiconductor device including an insulated-gate field-effect transistor has been widely used. Usually, such a semiconductor device is provided with an electrostatic discharge protection circuit (hereinafter, referred to as "ESD protection circuit"). The ESD protection circuit has a protection element which prevents damage due to surge current. The surge current is caused by ESD and is provided from the outside. The ESD protection circuit prevents ESD from damaging a gate insulating film of an insulated-gate field-effect transistor.

A FinFET is known as an insulated-gate field-effect transistor. The FinFET has a fin-shaped active semiconductor region. When an LSI is composed of FinFETs, a protection element of the LSI is also composed of FinFETs in practice.

JP 2007-53316, for example, discloses a protection element. The protection element has a high surge resistance for protecting a gate insulating film by employing a double-stacked structure. The protection element is provided with a plurality of gate electrodes and a plurality of gate insulating films which constitute FinFETs. The gate electrodes and the gate insulating films are stacked one after another. The double-stacked structure requires increase of the number of steps to manufacture the FinFETs of the protection element.

SUMMARY OF THE INVENTION

An aspect of the present invention provides a semiconductor device including a substrate, fins formed on the substrate, each of the fins being a semiconductor layer, the fins being located separately from one another, a gate insulating film formed on side surfaces of the fins, a gate electrode formed on the gate insulating film, the gate electrode including a gate contact portion to supply an electric signal, the gate electrode extending to cross over the fins, and first drain regions and first source regions formed in the respective fins, each of the first drain regions and the corresponding one of the first source regions being provided so as to sandwich each of portions of the fins located below the gate electrode, the first drain regions being electrically connected to one another, the first source regions being electrically connected to one another, wherein the fins, the gate insulating film, the gate electrode, the first drain regions and the first source regions constitute insulated-gate field-effect transistors respectively, and a width of first one of the fins is larger than that of second one of the fins, the second one of the fins being more distant from the gate contact portion than the first one of the fins.

Another aspect of the present invention provides a semiconductor device including a substrate, fins formed on the substrate, each of the fins being, a gate insulating film formed on side surfaces of the fins, a gate electrode formed on the gate insulating film, the gate electrode including a gate contact portion to supply an electric signal, the gate electrode extending to cross over the fins, and first drain regions and first source regions formed in the respective fins, each of the first drain regions and the corresponding one of the first source regions being provided so as to sandwich each of portions of the fins located below the gate electrode, the first drain regions being electrically connected to one another, the first source regions being electrically connected to one another, wherein the fins, the gate insulating film, the gate electrode, the first drain regions and the first source regions constitute insulated-gate field-effect transistors respectively, and a threshold voltage value of first one of the insulated-gate field-effect transistors is larger than that of second one of the other insulated-gate field-effect transistors, the second one of the insulated-gate field-effect transistors being more distant from the gate contact portion than the first one of the insulated-gate field-effect transistors.

Further another aspect of the present invention provides a semiconductor device including a substrate, fins formed on the substrate, the fins being a semiconductor layer, the fins being located separately from one another, a gate insulating film formed on each side surface of the fins, gate electrode portions formed on the gate insulating film, the gate electrode portions provided separately from one another so as to extend in substantially the same direction to cross over the fins, a gate contact portion to supply the gate electrode portions with an electric signal, first drain regions and first source regions formed in the respective fins, each of the first drain regions and the corresponding one of the first source regions being provided so as to sandwich each of portions of the fins located below the gate electrode portions, ones of the first source regions being electrically connected to each other, the ones of the first source regions being disposed on both end sides in a direction intersecting with the extending direction of the gate electrode portions wherein the fins, the gate insulating film, the gate electrode portions, the first drain regions and the first source regions constitute insulated-gate field-effect transistors respectively, the insulated-gate field-effect transistors being arranged in a matrix, the insulated-gate field-effect transistors are composed of a plurality of groups, the groups arranged in the direction intersecting with the gate electrode portions, each of the groups including plural ones of the insulated-gate field-effect transistors being connected in series to one another, and widths of first ones of the fins is larger than those of second ones of the fins, the second ones of the fins being more distant from the gate contact portion than the first ones of the fins.

BRIEF DESCRIPTION OF THE DRAWINGS

FIG. 1A is a plan view showing a semiconductor device according to a first embodiment of the invention. FIG. 1B is a cross-sectional view of the semiconductor device in FIG. 1A taken along the line A-A and viewed in an arrow direction. FIG. 1C is a cross-sectional view of the semiconductor device in FIG. 1A taken along the line B-B and viewed in an arrow direction.

FIGS. 3A to 7A are plan views respectively illustrating manufacturing steps of the semiconductor device shown in FIGS. 1A to 1C.

FIGS. 3B to 7B are cross-sectional views of the semiconductor devices in FIGS. 3A to 7A, respectively, taken along the lines A-A and viewed in arrow directions.

FIGS. 3C to 7C are cross-sectional views of the semiconductor devices in FIGS. 3A to 7A, respectively, taken along the lines B-B and viewed in arrow directions.

DETAILED DESCRIPTION OF THE INVENTION

Figure 2:
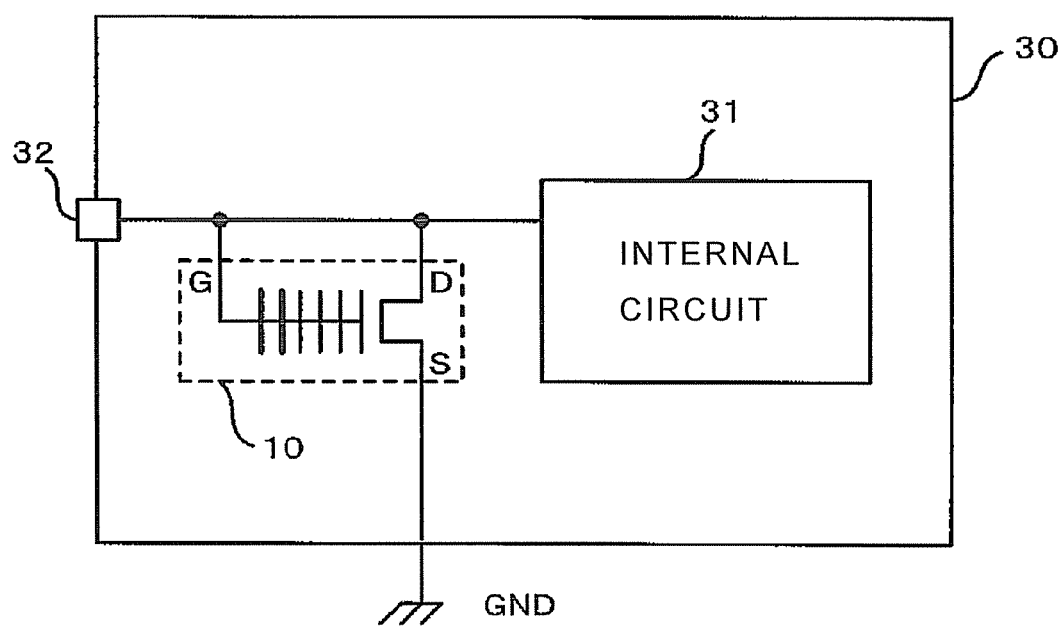
FIG. 2 is a circuit diagram showing a semiconductor integrated circuit using the semiconductor device as a protection element.

Embodiments of the invention will hereinafter be described with reference to the drawings.

A first embodiment of the invention will be described with reference to FIGS. 1A to 1C. FIG. 1A is a plan view showing a semiconductor device according to the first embodiment of the invention.

FIG. 1B is a cross-sectional view of the semiconductor device in FIG. 1A taken along the line A-A and viewed in an arrow direction. FIG. 1C is a cross-sectional view of the semiconductor device in FIG. 1A taken along the line B-B and viewed in an arrow direction.

As shown in FIGS. 1A to 1C, a semiconductor device 10 of the embodiment includes a plate-like supporter 11, an insulating layer 12, a plurality of fins 15a to 15f, a gate insulating film 16, a silicon nitride film 41 and a gate electrode 17. The supporter 11 is an N-type semiconductor layer. The fins 15a to 15f are P-type semiconductor layers and formed like protrusions. The fins 15a to 15f have the same height and length substantially.

The fins 15a to 15f are formed by selectively removing a P-type semiconductor layer 13 indicated by a dotted line. The supporter 11, the insulating layer 12 and the semiconductor layer 13 constitute a semiconductor substrate 14. The P-type semiconductor layer 13 may be a P-type well region. The insulating layer 12 is formed on the supporter 11. The semiconductor layer 13 is formed on the insulating layer 12. The semiconductor layer 13 is an SOI (Silicon on Insulator) layer 13.

The fins 15a to 15f are formed on the insulating layer 12. The fins 15a to 15f are provided separately from each other. Space regions 2 are provided between the neighboring fins 15a to 15f, respectively. The gate insulating film 16 is formed on each side surface of the fins 15a to 15f. The silicon nitride film 41 is formed under the gate electrode 17 and on the upper surfaces of the fins 15a to 15f. The gate electrode 17 exists on the silicon nitride film 41. The silicon nitride film 41 may be replaced with a silicon oxide film. The gate electrode 17 extends so as to cross over the fins 15a to 15f. Regions G1 to G6 of the fins 15a to 15f, which are located below the gate electrode 17 are channel formation regions.

Drain regions D1 to D6 and source regions S1 to S6 are formed in the semiconductor fins 15a to 15f, respectively. The Drain regions D1 to D6 and source regions S1 to S6 are, provided apart from each other to sandwich the channel formation regions. The drain regions D1 to D6 are formed integrally with a plate-like semiconductor drain region 18 which extends in parallel with the gate electrode 17. The source regions S1 to S6 are formed integrally with a plate-like semiconductor source region 19 which extends in parallel with the gate electrode 17.

The semiconductor substrate 14 may be manufactured as follows. Oxygen ions are implanted into a silicon substrate to reach a position deeper than the surface of the silicon substrate, for example. Then, the silicon substrate is heated at a high temperature. The semiconductor substrate 14 prepared by the above steps is a SIMOX (Separation by implantation of Oxygen) substrate having a structure where a silicon layer is stacked on a silicon oxide film formed on the silicon substrate.

A plurality of Fin insulated-gate field-effect transistors (hereinafter, referred to as "FinFETs") M1 to M6 are respectively composed of the gate electrode 17, and of the source regions S1 to S6 and the drain regions D1 to D6 formed in the fins 15a to 15f.

The fins 15a to 15f are formed substantially perpendicularly to principal surfaces of the supporter 11 and the insulating layer 12. The fins 15a to 15f are of a P-type. The source regions S1 to S6 and the drain regions D1 to D6 are of an N-type. The FinFETs M1 to M6 are N channel MOSFETs.

The fins 15a to 15f, the source region 18 and the drain region 19 are formed by excavating the silicon layer (SOI layer) 13 located on the insulating layer 12, from the surface to the insulating layer 12. Accordingly, the heights of the fins 15a to 15f, the source region 18 and the drain region 19 are equal to one another. The heights are set approximately 70 nm that is substantially equivalent to the thickness of the silicon layer (SOI layer) 13.

A gate contact portion 20 is formed at one end of the gate electrode 17 to supply an electric signal to the gate electrode 17 from outside.

Widths W1 to W6 of the fins 15a to 15f are formed such that the widths of plural ones of the fins, the distances of which are short from the gate contact portion 20, are large, and that, the widths of the rest of the fins, the distance of which are long from the gate contact portion 20, are narrow.

Specifically, the width W1 of the fin 15a closest to the gate contact portion 20 is formed to be equal to the width W2 of the fin 15b, which is secondly closest to the gate contact portion 20. The widths W1, W2 of the fins 15a, 15b are formed to be wider than the widths W3 to W6 of the fins 15c to 15f, that are the thirdly to sixthly closest to the gate contact portion 20. The widths W3 to W6 of the fins 15c to 15f satisfy the following relationship,

W1=W2>W3=W4=W5=W6.

The gate electrode 17 is connected from the gate contact portion 20 through a wire 21 to an input-output terminal (not illustrated in FIGS. 1A to 1C) which will be described later.

A drain contact electrode 22 is formed closer to the drain D1 and on the drain region 18. The drain region 18 is connected to the input-output terminal through a wire 23 from the drain contact electrode 22. A source contact electrode 24 is formed closer to the source region S1, on the source region 19. The source region 19 is connected to a power supply GND through the source contact electrode 24 to acquire a reference potential from the power supply GND.

FIG. 2 is a diagram showing a configuration of a semiconductor integrated circuit using the above-described semiconductor device 10 as a protection element against ESD. The semiconductor integrated circuit is an LSI.

As shown in FIG. 2, a semiconductor integrated circuit 30 includes an internal circuit 31, an input-output terminal 32 connected to the internal circuit 31, and the semiconductor device 10. The internal circuit 31 is a logic circuit having multiple FinFETs, for example. The gate electrode 17 and the drain electrode 18 of the semiconductor device 10 shown in FIG. 1A are connected to a connection line between the input-output terminal 32 and the internal circuit 31 in FIG. 2. The gate electrode 17 and the drain region 18 of the semiconductor device 10 are short-circuited.

The source region 19 of the semiconductor device 10 in FIG. 1A is grounded in FIG. 2.

When a surge current flows into the input-output terminal 32, the semiconductor device 10 is turned on to cause the surge current to pass through the semiconductor device 10. Consequently, the surge current is prevented from flowing into the internal circuit 31. The semiconductor device 10 functions as an ESD protection element.

When a voltage, not a surge, equal to or lower than a threshold voltage value of the semiconductor device 10 is applied to the input-output terminal 32 in a normal operation, the semiconductor device 10 is not turned on. Consequently, an exchange of signals between the internal circuit 31 and the outside can be carried out through the input-output terminal 32.

When a surge current flows into the input-output terminal 32, the operation timing, at which the FinFETs M1 to M6 of the semiconductor device 10 in FIGS. 1A to 1C, depends on layout of metal layers. The metal layers are the wires 21, 23 or metal layers such as metal pads formed on the contact portion 20 and contact electrodes 22, 24.

Specifically, the FinFET closer to the gate contact portion 20, which is bonded to the wire 21, operates first, and the FinFET farther from the gate contact portion 20 operates later. Generally, the FinFET M1 closest to the gate contact portion 20 operates first, and the FinFET M6 farthest from the gate contact portion 20 operates last.

During the event, a surge current flows concentratedly into the FinFET M1 which has been turned on first. A large current flows into the FinFET M1 during a short time period. As a result, it may cause the FinFET M1 to melt.

In the embodiment shown in FIGS. 1A to 1C, the widths W1, W2 of the fins 16a, 15b in the FinFETs M1, M2, which are closer to the gate contact portion 20, are set wider than the widths W3 to W6 of the fins 15c to 15f in the FinFETs M3 to M6 which are farther from the gate contact portion 20.

As a result, the resistances of the drains D1, D2 and the sources S1, S2 in the FinFETs M1, M2 are decreased, and the current capacities of the FinFETs M1, M2 are increased.

Thus, even when a surge current flows concentratedly into the FinFETs M1, M2, the semiconductor layers such as the fins 15a to 15f are hard to melt so that the semiconductor device 10 can work effectively as the ESD protection element.

A manufacturing method of the semiconductor device 10 will be described below. FIGS. 3A to 7A, FIGS. 3B to 7B and FIGS. 3C to 7C illustrate the respective manufacturing steps of the semiconductor device 10.

FIGS. 3A to 7A are plan views. FIGS. 3B to 7B are cross-sectional views of the semiconductor devices in FIGS. 3A to 7A, respectively, taken along the lines A-A and viewed in arrow directions. FIGS. 3C to 7C are cross-sectional views of the semiconductor devices in FIGS. 3A to 7A, respectively, taken along the lines B-B and viewed in arrow directions.

Figures 3A, 3C:
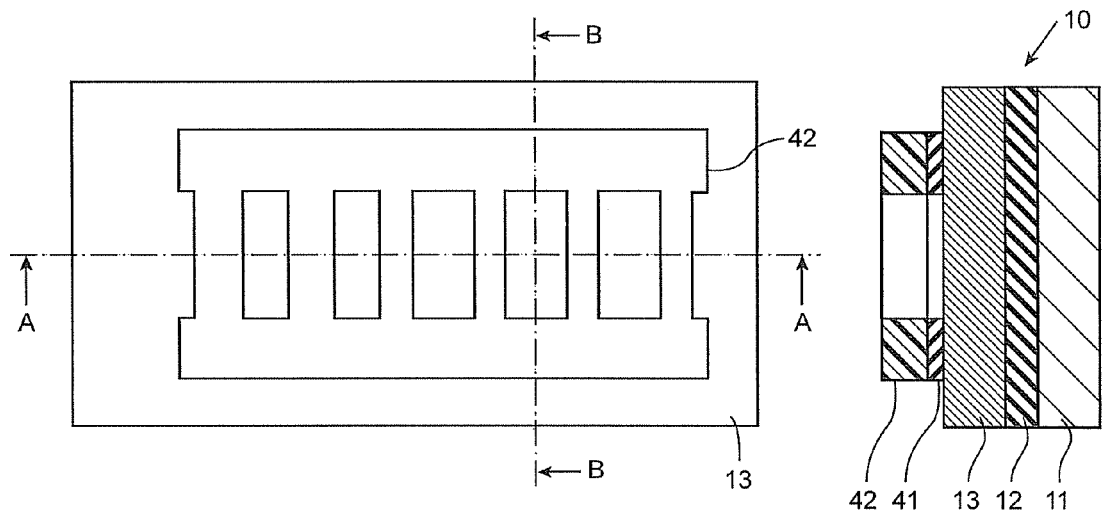
Figure 3B:
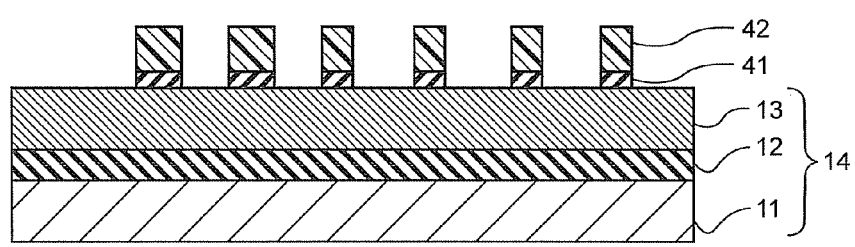

As shown in FIGS. 3A to 3C, the silicon nitride film 41 is formed as an insulating film on the entire surface of the semiconductor layer 13 in the semiconductor substrate 14. The silicon nitride film 41 is formed by a plasma CVD (Chemical Vapor Deposition) method, for example. In place of the silicon nitride film 41, a silicon oxide film may be used.

A resist film 42 is formed on the silicon nitride film 41 by a photolithography method. The resist film 42 has a pattern corresponding to a pattern of the fins 15a to 15f, the drain region 18 and the source region 19 of FIGS. 1A to 1C.

The silicon nitride film 41 is etched using the resist film 42 as a mask. Thus, the silicon nitride film 41 having the pattern transferred from the resist film 42 is obtained. The etching of the silicon nitride film 41 is performed by a RIE (Reactive Ion Etching) method, for example.

Figure 4A:
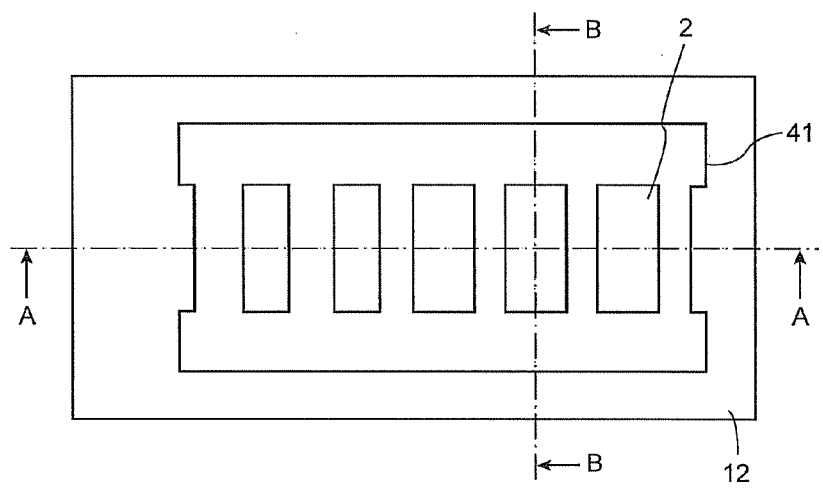
Figure 4C:
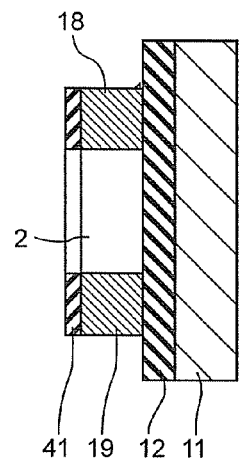
Figure 4B:
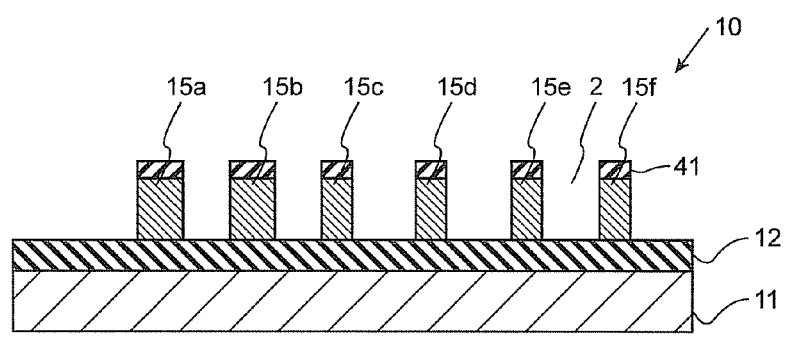

As shown in FIGS. 4A to 4C, the semiconductor layer 13 is etched down to the insulating layer 12 using the patterned silicon nitride film 41 as a mask. Accordingly, the fins 15a to 15f of the FinFETs M1 to M6, the semiconductor layer 18 to be a drain region, and the semiconductor layer 19 to be a source region are formed simultaneously. The semiconductor layer 13 is etched by the RIE method, for example. The space regions 2 are formed between the neighboring fins 15a to 15f, respectively.

Figures 5A, 5C:
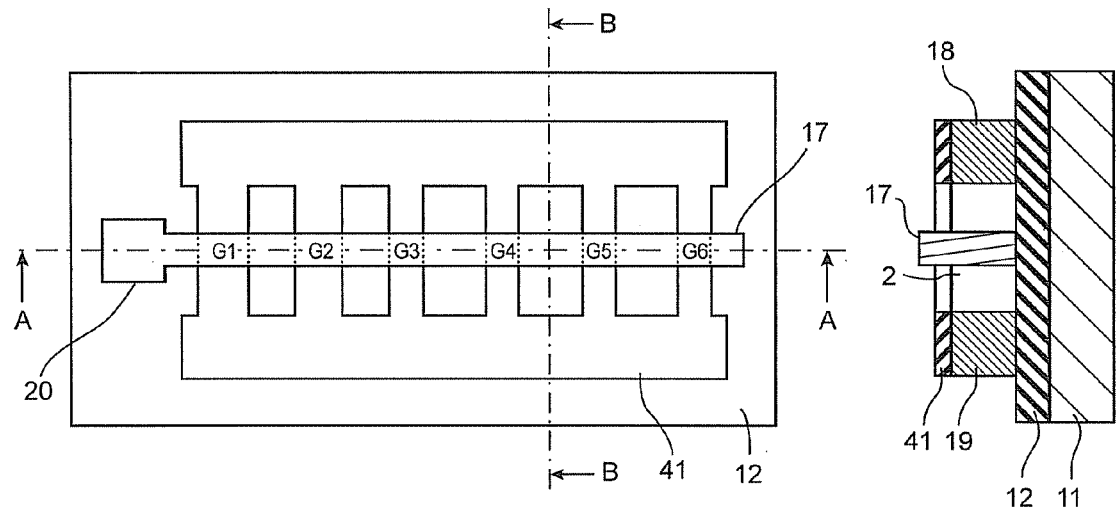
Figure 5B:
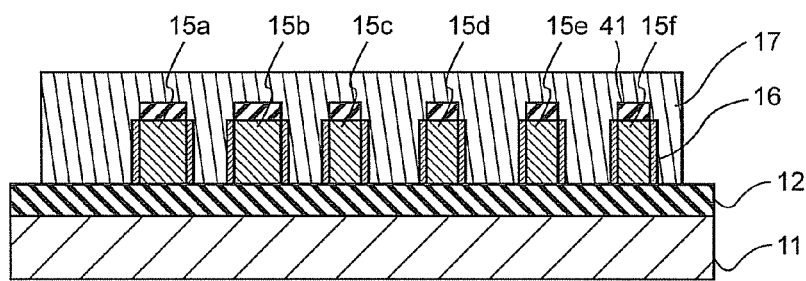

As shown in FIGS. 5A to 5C, a silicon oxide film having a thickness of approximately 1.2 nm is formed on each side wall of the semiconductor layers 18, 19 and on the fins 15a to 15f of the FinFETs M1 to M6. The silicon oxide film is formed by an RTO (Rapid Thermal Oxidation) method, for example. Before forming the silicon oxide film, the silicon nitride film 41 may be removed, and the silicon oxide film may be formed on and above the fins 15a to 15f as well.

The silicon oxide film is plasma-nitrified to increase the permittivity of the silicon oxide film, and then the gate insulating film 16 is formed. In FIGS. 5A to 5C, the illustration of the silicon oxide film formed on each side wall of the semiconductor layers 18, 19 is omitted.

Furthermore, a polysilicon film (not illustrated) having a thickness of approximately 100 nm is formed on the fins 15a to 15f, the drain region 18, the source region 19 and the exposed insulating film 12 by the CVD method, for example.

A silicon nitride film (not illustrated) serving as a hard mask is formed on the entire surface of the polysilicon film. A resist film (not illustrated) is formed on the silicon nitride film by the photolithography method. The resist film has a pattern corresponding to the gate electrode 17 and the gate contact portion 20. The silicon nitride film is etched by the RIE method using the resist film as a mask. As a result, the silicon nitride film thus obtained has a transferred pattern corresponding to the pattern of the gate electrode 17 and the gate contact portion 20.

Then, the polysilicon film is etched by the RIE method using the patterned silicon nitride film as a mask. As a result, the gate electrode 17 and the gate contact portion 20 shown in FIGS. 5A and 5B are formed. Accordingly, the regions G1 to G6 of the FinFETs M1 to M6 are formed.

As shown in FIGS. 6A to 6C, ions of an N-type impurity such as arsenic (As) ions are implanted into the fins 15a to 15f obliquely from the above through the gate insulating film 16, so that N-type extension regions of small thicknesses are formed in the fins 15a to 15f. The arsenic (As) ions are implanted at an accelerating voltage of 0.5 keV and a dose of $2 \times 10^{15}$ atoms/cm$^2$, approximately. In FIGS. 6A to 6C, the illustration of the silicon oxide film formed on each side wall of the semiconductor layers 18, 19 is omitted.

As shown in FIG. 7A to FIG. 7C, a silicon oxide film 43 is formed on each side wall of the fins 15a to 15f, the semiconductor layers 18, 19 and the gate electrode 17, respectively. The gate insulating film 16 formed in the step of FIGS. 5A to 5C is integrally illustrated as the silicon oxide film 43 in FIGS. 7A to 7C.

The illustration of the silicon oxide films 43 shown in FIGS. 7A to 7C is omitted in FIGS. 1A to 1C.

Subsequently, ions of an N-type impurity such as arsenic (As) ions are implanted into the fins 15a to 15f via the silicon nitride film 41 and the silicon oxide film 43 obliquely from the above. As a result, the drain regions D1 to D6 and the drain region 18 as well as the source regions S1 to S6 and the source region 19, i.e. impurity regions, are formed to sandwich the regions G1 to G6. The implantation of the arsenic (As) ions is performed at an accelerating voltage of 10 to 20 keV and a dose of $1\times10^{13}$ to $2\times10^{15}$ atoms/cm², approximately. Subsequently, A heat-annealing is performed. By the above-described steps, the FinFETs M1 to M6 are formed.

After the ion-implantation and the heat-annealing, a metal film such as a nickel film including platinum may be formed on the entire surface, and, by annealing under the temperature of 400° C., a metal-silicide layer may be formed. In the case, an unreacted portion of the metal film is removed by a wet process using a mixture of sulfuric acid and oxygenated water. Subsequently, as shown in FIG. 1C, the silicon nitride film 41 may be removed.

A different insulating film (not illustrated) such as a silicon oxide film, is formed on the FinFETs M1 to M6 and the exposed insulating film 12. The insulating film is formed by the CVD method, for example. Thereafter, the surface of the insulating film is flattened by a CMP (Chemical Mechanical Polishing) method, for example.

A resist pattern is formed by the photolithography method. The resist pattern has openings corresponding to contact holes to form the gate contact portion 20, the drain contact electrode 22 and the source contact electrode 24 respectively of FIG. 1A. The insulating film is etched by the RIE method, for example, using the resist pattern as a mask. Thus, the contact holes are formed.

The gate contact portion 20, the drain contact electrode 22 and the source contact electrode 24, respectively of FIG. 1A, are formed. Bonding pads are formed on the drain contact electrode 22 and the source contact electrode 24 through vias.

Furthermore, the bonding pads are covered with passivation films except for the regions subjecting to wire bonding.

Then, the gate contact portion 20 and the drain contact electrode 22 are connected to the input-output terminal 32 of FIG. 2 by wire bonding, and the source contact electrode 24 is grounded. Consequently, a semiconductor device is obtained.

As has been described above, in the embodiment, the width W1 of the fin 15a is equal to the width W2 of the fin 15b, and the widths W3 to W6 of the fins 15c to 15f are equal to one another. The widths W1 to W6 of the fins 15a to 15f ought to only satisfy the following relationship.

W1≥W2>W3, W4, W5, W6

Within the array of the FinFETs M1 to M6 of the embodiment, the fin widths W of the FinFET M3 and the FinFETs on the left side of the FinFET M3 in FIG. 1A are changed. Instead, the fin width(s) W of the FinFET(s) on the left side of any FinFET in FIG. 1A may be changed.

The fin widths W of the neighboring FinFETs M1 to M6 may be changed in such a continuous manner as to satisfy the following relationship.

W1≥W2≥W3≥W4≥W5≥W6

As long as the FinFETs M1 to M6 have the same properties, the FinFETs may be of partially depleted type or of fully depleted type.

Figure 8A:
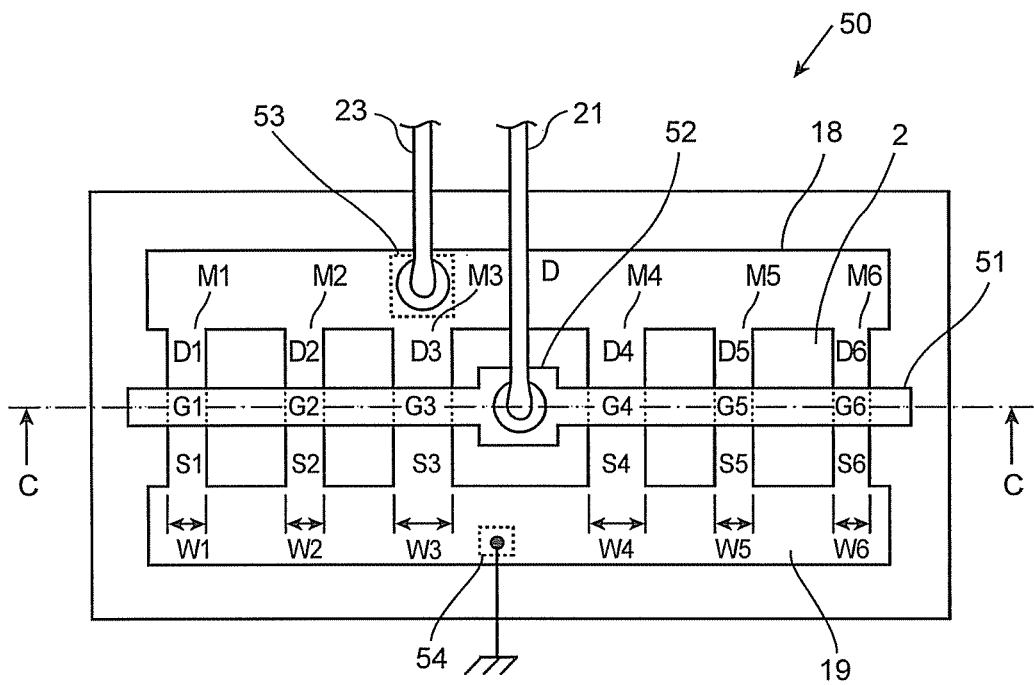
FIG. 8A is a plan view showing a semiconductor device according to a second embodiment of the invention.
Figure 8B:
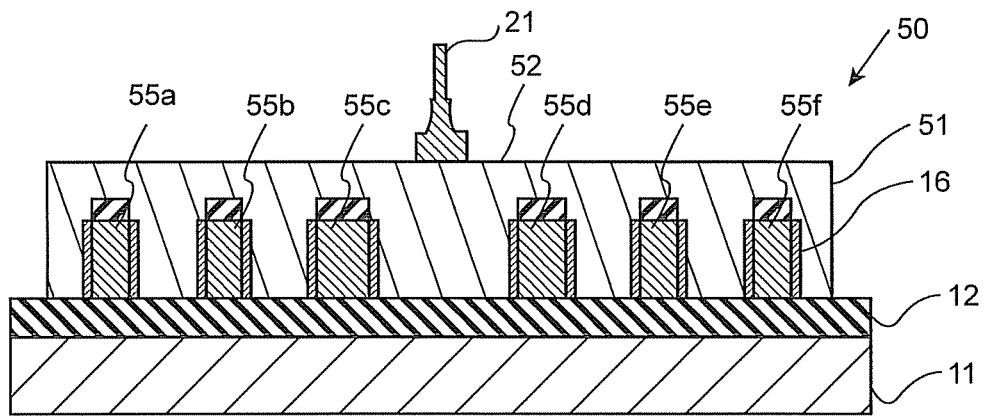
FIG. 8B is a cross-sectional view of the semiconductor device in FIG. 8A taken along the line C-C and viewed in an arrow direction.

FIGS. 8A and 8B show a semiconductor device according to a second embodiment of the invention. FIG. 8A is a plan view. FIG. 8B is a cross-sectional view taken along the line C-C in FIG. 8A and viewed in an arrow direction.

In FIGS. 8A and 8B, the same reference symbols as those in FIGS. 1A and 1B denote the same portions.

As shown in FIGS. 8A and 8B, a semiconductor device 50 of the embodiment includes a gate contact portion 52 of a gate electrode 51. The gate contact portion 52 is formed on a central portion of the gate electrode 51.

Because the gate contact portion 52 is formed on the central portion of the gate electrode 51, a drain contact electrode 53 is formed near a central portion of the drain region 18. A source contact electrode 54 is formed near a central portion of the source region 19.

Widths W1 to W6 of fins 55a to 55f are formed such that the width of a fin closer to the gate contact portion 52 is wider than the width of a fin farther from the gate contact portion 52.

The widths W3, W4 of the fins 55c, 55d closest to the gate contact portion 52 are formed to be equal to each other. The widths W3, W4 of the fins 55c, 55d are formed to be wider than the widths W2, W4 of the fins 55b, 55e that are the secondly closest to the gate contact portion 52. The widths W3, W4 of the fins 55c, 55d are formed to be wider than the widths W3, W5 of the thirdly closest fin 55a, 55f. The widths W1 to W6 of the fins 55a to 55f are formed to satisfy the following relationship.

W3=W4>W1=W2=W5=W6

Accordingly, when a surge current flows into the input-output terminal 32 in FIG. 2, the FinFETs M3, M4 that are the closest to the gate contact portion 52 among the FinFETs M1 to M6 of the semiconductor device 50 in FIGS. 8A and 8B operate first. The secondly closest FinFETs M2, M5 operate next. The thirdly closest FinFETs M1, M6 operate last.

The widths W3, w4 of the fins 55c, 55d in the FinFETs M3, M4 that operates first are formed to be wide. Thus, even when a surge current flows concentratedly into the FinFETs M3, M4, the semiconductor layers such as the fins do not melt. The semiconductor device 50 can work effectively as an ESD protection element.

Furthermore, the distance from the gate contact portion 52 to the farthest fins 55a, 55f is approximately half the distance from the gate contact portion 20 to the farthest fin 15f shown in FIG. 1A.

Thus, delay in the timing, at which the FinFETs M1 to M6 operate, is shortened to reduce the degree of the surge current flowing concentratedly into the FinFETs M3, M4, which have operated firstly.

Therefore, the difference between the widths W3, W4 of the fins 55c, 56d and the widths W1, W2, W4, W5 of the fins 55a, 56b, 56e, 55f can be minimized.

In the embodiment, the case, where the gate contact portion 52 is formed in the center of the gate electrode 51, is described. The gate contact portion 52 may be shifted in any direction from the center.

Figure 9A:
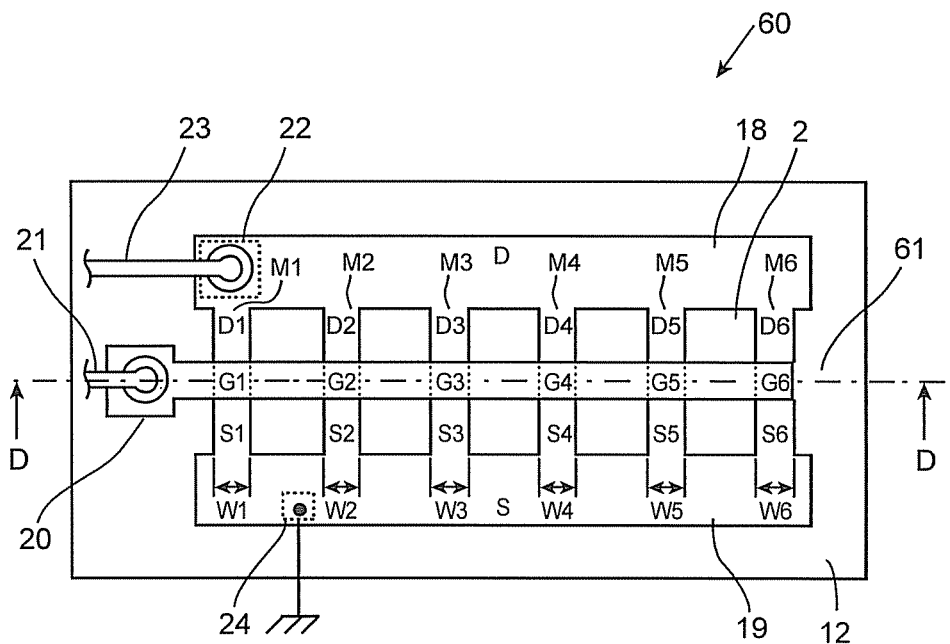
FIG. 9A is a plan view showing a semiconductor device according to a third embodiment of the invention.
Figure 9B:
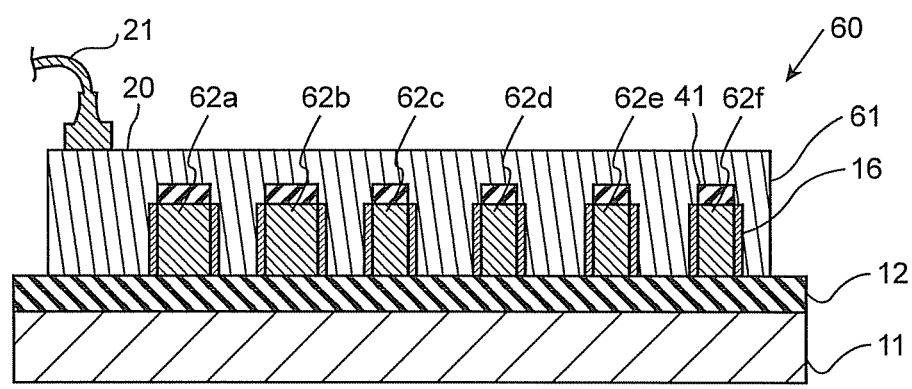
FIG. 9B is a cross-sectional view of the semiconductor device in FIG. 9A taken along the line D-D and viewed in an arrow direction.

FIGS. 9A and 9B show a semiconductor device according to a third embodiment of the invention. FIG. 9A is a plan view. FIG. 9B is a cross-sectional view taken along the line D-D in FIG. 9A and viewed in an arrow direction.

In FIGS. 9A and 9B, the same reference symbols as those in FIGS. 1A and 1B denote the same portions.

As shown in FIGS. 9A and 9B, in a semiconductor device 60 of the embodiment, a threshold voltage value Vth of a FinFET closer to the gate contact portion 20 on a gate electrode 61 is set greater than a threshold voltage value Vth of a FinFET farther from the gate contact portion 20.

A threshold voltage value Vth1 of the FinFET M1 closest to the gate contact portion 20 is set equal to a threshold voltage value Vth2 of the FinFET M2 secondly closest to the gate contact portion 20. Furthermore, the threshold voltage value Vth1 is set greater than threshold voltage values Vth3 to Vth6 of the FinFETs M3 to M6 that are the thirdly to sixthly closest to the gate contact portion 20. The threshold voltage values Vth1 to Vth6 are set to satisfy the following relationship.

Vth1=Vth2>Vth3=Vth4=Vth5=Vth6

Figure 10:
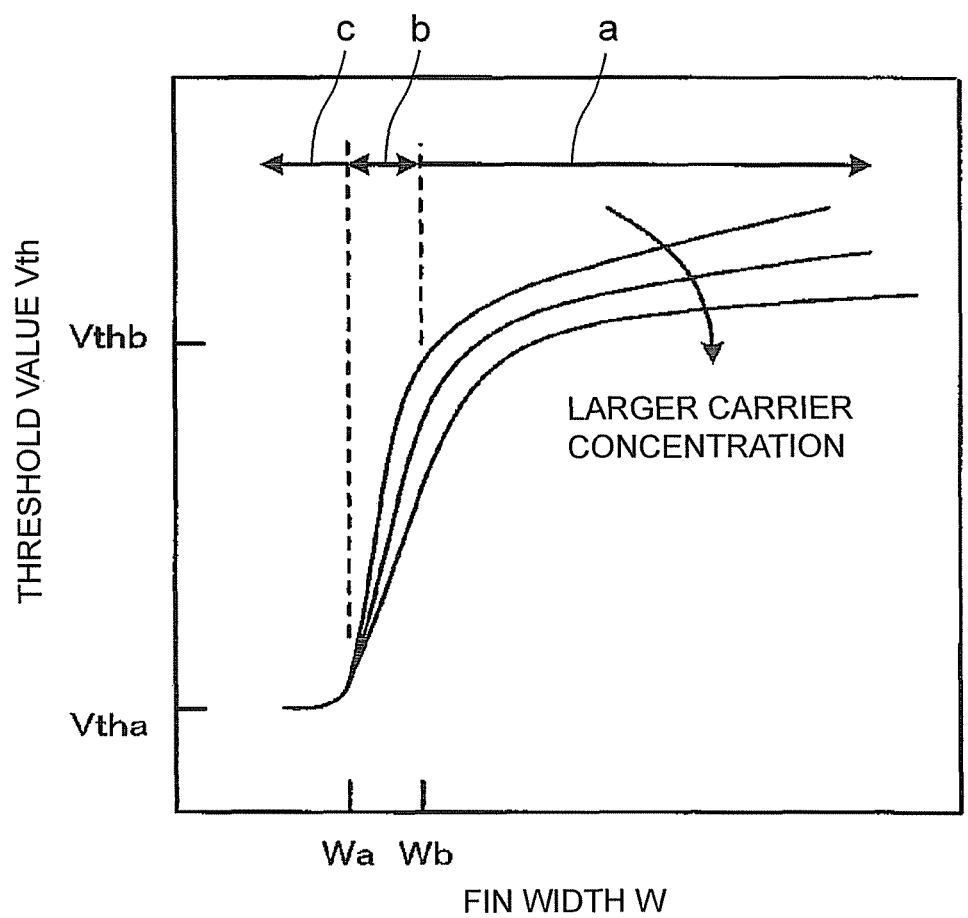
FIG. 10 illustrates a relationship between a fin width and a threshold voltage value of the semiconductor device according to the third embodiment with a carrier concentration of the fin serving as a parameter.

FIG. 10 illustrates relationship between the fin width and the threshold voltage value of the FinFET with a carrier concentration of the fin serving as a parameter of the relationship.

As shown in FIG. 10, the relationships between the fin width and the threshold voltage value of the FinFET are sorted by three regions, i.e., a region a, a region b, and a region c depending on the fin width.

In the region a where the fin width is wide, the threshold voltage value depends less on the fin width, but strongly depends on the carrier concentration. In the region a, the higher the carrier concentration of the fin is, the smaller the threshold voltage value is.

In the region c where the fin width is narrow, the threshold voltage value does not depend on the fin width or the carrier concentration. Since the fin width is narrow in the region c, depletion regions extending from both side surfaces of the fin are combined together. Thus, the FinFET operates as a fully depleted type MOS transistor, and a constant threshold voltage value is obtained.

The region b is a transition region between the region a and the region c. The threshold voltage value has a considerably strong dependence on the fin-width in the region b.

In the embodiment, widths W1 to W6 of fins 62a to 62f are set equal to one another in the region a. By changing the carrier concentrations of the fins 62a to 62f, the threshold voltage values Vth1 to Vth6 of the FinFETs M1 to M6 are altered.

The carrier concentrations of the fins 62a to 62f can be altered by a well-known method. The carrier concentration is changed by implanting impurity ions to serve as carriers in the fins 62a to 62f, for example, while adjusting the dose of the ions.

In the embodiment, when a surge current flows into the input-output terminal 32 in FIG. 2, the FinFETs M3 to M6 operate first among the FinFETs M1 to M6 of the semiconductor device 60, and then the FinFETs M1, M2 operate. This is because the threshold voltage values Vth1, Vth2 of the FinFETs M1, M2, which are the firstly and secondly closest to the gate contact portion 20, are set greater than the threshold voltage values Vth3 to Vth6 of the thirdly to sixthly FinFETs M3 to M6 which are far from the gate contact portion 20.

While flowing to the FinFETs M3 to M6 that are far from the gate contact portion 20, the surge current flowed into the input-output terminal 32 is averaged, and the concentration of the surge current is mitigated.

Thus, the semiconductor layers such as the fins are prevented from melting, and the semiconductor device 60 can work effectively as a protection element against ESD.

The embodiment has an advantage that the widths W1, W2 of the fins 62a, 62b closer to the gate contact portion 20 do not need to be widened, and is capable of reducing the chip area.

In the embodiment, the threshold voltage values Vth1, Vth2 are equal to each other, and the threshold voltage values Vth3 to Vth6 are equal to one another.

The threshold voltage values Vth1 to Vth6 may not be equal to one another but must satisfy the following relationship.

Vth1≧Vth2>Vth3 to Vth6

In the embodiment, within the array of the FinFETs M1 to M6, the threshold voltage values of the fins in the FinFETs are changed on the left side of the FinFET M3 in FIG. 9A. Instead, the threshold voltage value(s) of the fin(s) in the FinFET(s) may be changed on the left side of the FinFET other than the FinFET M3 in FIG. 9A. Furthermore, the threshold voltage values among the neighboring FinFETs may be changed continuously so as to satisfy the following relationship.

Vth1≧Vth2≧Vth3≧Vth4≧Vth5≧Vth6

In the embodiment, the fin widths W are made uniform, and the threshold voltage values of the FinFETs M1 to M6 are changed by the carrier concentration of the fin. By adjusting both the fin width W and the carrier concentration, the threshold voltage values of the FinFETs M1 to M6 can be changed. By such adjustment, the threshold voltage values of the FinFETs M1 to M6 can be set more precisely.

Figure 11A:
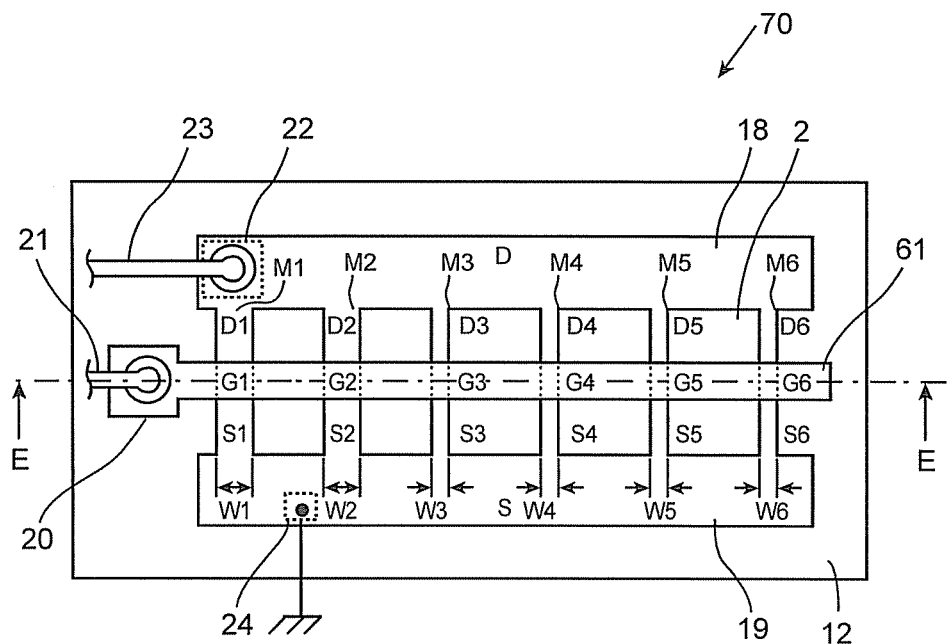
FIG. 11A is a plan view showing a semiconductor device according to a fourth embodiment of the invention.
Figure 11B:
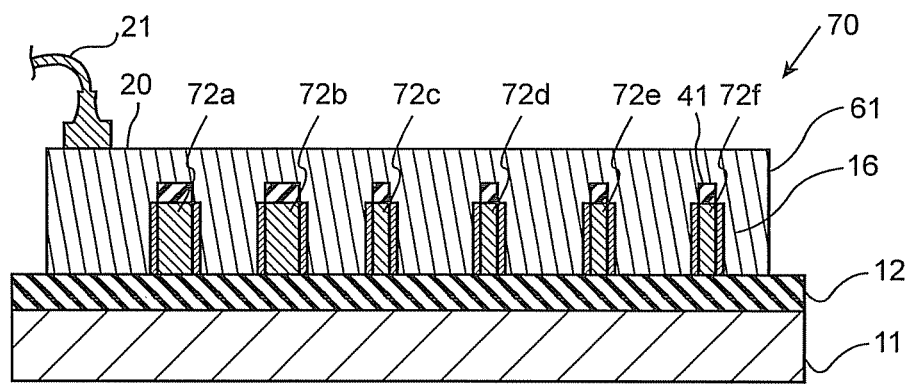
FIG. 11B is a cross-sectional view of the semiconductor device in FIG. 11A taken along the line E-E and viewed in an arrow direction.

FIG. 11A is a plan view showing a semiconductor device according to a fourth embodiment of the invention. FIG. 11B is a cross-sectional view of the semiconductor device in FIG. 11A taken along the line E-E and viewed in an arrow direction.

In FIGS. 11A and 11B, the same reference symbols as those in FIGS. 9A and 9B denote the same portions.

As shown in FIG. 11A, the FinFET M1 closest to the gate contact portion 20 and the FinFET M2 secondly closest are set to be FinFETs of partially depleted type. In the meanwhile, the FinFETs M3 to M6, which are, respectively, thirdly to sixthly closest to the gate contact portion 20, are set to be of fully depleted type.

Widths W1 to W6 of fin 72a to 72f are set to be in the following relationship. In the following equation, Wa represents a fin width of FinFETs shown in FIG. 9A being of fully depleted type. Wb represents a fin width of FinFETs shown in FIG. 9A being of partially depleted type.

W1=W2>Wb>Wa>W3=W4=W5=W6

By setting the fin widths as above, the threshold voltage values Vth1 to Vth6 of the FinFETs M1 to M6 has the following relationship. In the following equation, Vtha represent a threshold voltage value of the FinFETs which have structures shown in FIG. 9A respectively and which are of fully depleted type. Vthb represents a threshold voltage value of FinFETs which have structures shown in FIG. 9A respectively and which are of partially depleted type.

Vth1=Vth2>Vthb>Vth3=Vth4=Vth5=Vth6≈Vtha

As has been described, a semiconductor device 70 of the embodiment is provided with the FinFETs of partially depleted type on the side closer to the gate contact portion 20. The semiconductor device 70 is provided with the FinFETs of fully depleted type on the side far from the gate contact portion 20.

With such a configuration, the threshold voltage value can be changed with the fin width W. Thus, an ion implantation steps to change a threshold voltage value is no longer necessary, and the number of the manufacturing steps can be reduced.

In the above-described embodiment, the case, where the FinFETs are connected in parallel, is shown. Instead, a plurality of circuits, each of which is composed of FinFETs connected in series, may be connected in parallel to each other as in the following fifth embodiment.

Figure 12:
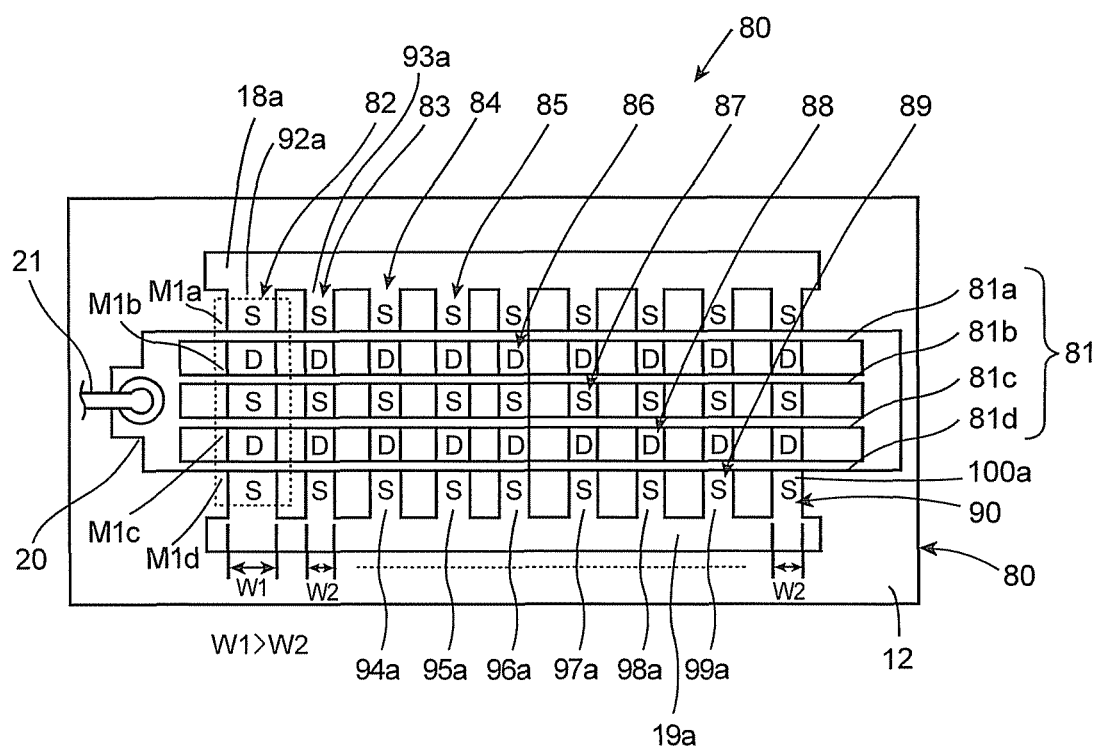
FIG. 12 is a plan view showing a semiconductor device according to a fifth embodiment of the invention.

FIG. 12 is a plan view showing a semiconductor device according to the fifth embodiment of the invention.

As shown in FIG. 12, a semiconductor device 80 includes fins 92a, . . . , 100a made of semiconductor. A substrate 90 having a three-layer structure as in FIGS. 1B and 9B is composed of the fin 92a, . . . , 100a, an insulating layer 12 and a supporter (not illustrated). The insulating layer 12 covers the periphery of the fins 92a, . . . , 100a.

Furthermore, the semiconductor device 80 includes a multi-finger-like gate electrode 81 to form FinFETs. The gate electrode 81 includes gate electrode portions 81a to 81d extending on the fin 92a, ..., 100a. The gate electrode portions 81a to 81d are away from each other and extend in substantially the same direction. The gate electrode portions 81a to 81d are formed so as to cross over the fins 92a, ..., 100a. The gate electrode portions 81a to 81d are connected so as to integrate with one another on the left side of FIG. 12. The gate electrode portions 81a to 81d are connected to a wire through a gate contact portion 20.

Source regions S, ..., S and drain regions D, ..., D constituting the FinFETs are formed in the fins 92a, ..., 100a.

For example, a M1a has the source region S and the drain region D sandwichlayer the gate electrode portion 81a. A FinFET M1b has the drain region D and the source region S sandwiching the gate electrode portion 81b. A FinFET M1c has the source region S and the drain region D sandwiching the gate electrode portion 81c. A FinFET M1d has the drain region D and the source region S sandwiching the gate electrode portion 81d.

The source regions S, ..., S and the drain regions D, ..., D of the FinFETs M1a to M1d are alternately connected in series to constitute a series circuit 82. A drain region of one of two adjoining insulated-gate field-effect transistors is connected to a drain region of the other insulated-gate field-effect transistor, or a source region of one of two adjoining insulated-gate field-effect transistors is connected to a source region of the other insulated-gate field-effect transistor.

Series circuits 83 to 90 having the same configuration as the series circuit 82 are provided in the semiconductor device 80. The series circuits 82 to 90 extend perpendicularly to the extending direction of the gate electrode portions 81a to 81d. The FinFETs of the semiconductor device 80 are arranged in a matrix.

The source regions on the upper and lower ends of the series circuits 82 to 90 are formed integrally with source regions 18a, 19a, respectively. The series circuits 82 to 90 are connected in parallel through the source regions 18a, 19a on the two end sides in the crossing direction.

In the semiconductor device 80, a width W1 of the fin 92a closest to the gate contact portion 20 is formed to be wider than widths W2 of the fins 93a, ..., 100a that are farther from the gate contact portion 20. The widths of the fins 93a, ..., 100a farther from the gate contact portion 20 are all formed to be W2 and equal to one another.

With such a configuration, the surge current capacity of the semiconductor device 80 can be increased. The number of FinFETs constituting each of the series circuits 82 to 90 can be selected in accordance with the usage condition of the semiconductor device 80 as appropriate.

The threshold voltage value of the FinFET closest to the gate contact portion 20 may be set greater than the threshold voltage values of the FinFETs farther from the gate contact portion 20 by making the widths of the fins 92a, ..., 100a all equal.

In the above-described fifth embodiment, it is possible to adopt a configuration without the drain region 18a and the source region 19a.

For example, a first interlayer insulating film (not illustrated) is formed on the substrate 80 to cover the gate electrode 81. The sources S, S are connected to a comb-like wiring in common through first vias, respectively. The comb-like wiring is formed on the first interlayer insulating film. The first vias are provided in the first interlayer insulating film. The comb-like wiring is connected to a source contact electrode.

Furthermore, a second interlayer insulating film is formed to cover the comb-like wiring. The drains D, ..., D are connected to a flat wiring in common through second vias. The flat wiring is connected to a drain contact electrode.

In the above-described embodiments, the FinFETs are the N channel MOSFETs. Instead of the N channel MOSFETs, the FinFETs may be P channel MOSFETs.

In the above-described embodiments, the SIMOX substrate is used as the semiconductor substrate 14. The invention is not limited to this. A so-called bonding substrate formed of two silicon substrates bonded with a silicon oxide film in between may be used as the semiconductor substrate 14. One of the silicon substrates of the bonding substrate is polished to reduce a thickness of the silicon substrate for use.

Furthermore, a so-called pn isolation substrate may be used as the semiconductor substrate 14. The pn isolation substrate is formed of a silicon substrate, an isolation layer, and a well layer. The isolation layer is of an opposite conductivity type to that of the silicon substrate, and formed on the silicon substrate. The well layer is of the same conductivity type as that of the silicon substrate. The isolation layer isolates the well layer from the silicon substrate.

By excavating the surface of the well layer down to the isolation layer, a FinFET can also be formed from the pn isolation substrate as in the case of the bonding substrate.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. An ESD protection semiconductor device comprising:
   a substrate;
   fins formed on the substrate, each of the fins being a semiconductor layer, the fins being located separately from one another;
   a gate insulating film formed on side surfaces of the fins;
   a gate electrode formed on the gate insulating film, the gate electrode including a gate contact portion to supply an electric signal, the gate electrode extending to cross over the fins;
   first drain regions and first source regions formed in the respective fins, each of the first drain regions and the corresponding one of the first source regions being provided so as to sandwich each of portions of the fins located below the gate electrode, the first drain regions being electrically connected to one another, the first source regions being electrically connected to one another;
   a drain contact portion formed on the substrate to supply an electric current to the first drain regions;
   a source contact portion formed on the substrate to connect the first source regions to a power supply; and
   a terminal to connect with outside and an internal circuit,
   wherein the fins, the gate insulating film, the gate electrode, the first drain regions and the first source regions constitute insulated-gate field-effect transistors respectively, and a width of first one of the fins is larger than that of second one of the fins, the second one of the fins being more distant from the gate contact portion and the drain contact portion than the first one of the fins,
   wherein the gate contact portion and the drain contact portion are connected to the terminal, and
   wherein the fins have the same height and length substantially.

2. The semiconductor device according to claim 1, wherein a threshold voltage value of first one of the insulated-gate field-effect transistors is greater than that of second one of the other insulated-gate field-effect transistors, the first one of the fins constituting the first one of the insulated-gate field-effect transistors, the second one of the fins constituting the second one of the insulated-gate field-effect transistors.

3. The semiconductor device according to claim 1, wherein widths of a plurality of the fins are substantially same.

4. The semiconductor device according to claim 1, further comprising a second drain region and a second source region respectively formed on the substrate, and a drain contact electrode, wherein
the second drain region is connected to the first drain regions,
the second source region is connected to the first source regions, and
the drain contact electrode is formed on the second drain region on a side of the gate contact portion.

5. The semiconductor device according to claim 1, wherein plural ones of the fins and the other ones of the fins are disposed on both sides of the gate contact portion, respectively, and widths of ones of the fins closest to the gate contact portion are larger than widths of the other fins.

6. An ESD protection semiconductor device comprising:
a substrate:
fins formed on the substrate, each of the fins being a semiconductor layer, the fins being located separately from one another;
a gate insulating film formed on side surfaces of the fins;
a gate electrode formed on the gate insulating film, the gate electrode including a gate contact portion to supply an electric signal, the gate electrode extending to cross over the fins;
first drain regions and first source regions formed in the respective fins, each of the first drain regions and the corresponding one of the first source regions being provided so as to sandwich each of portions of the fins located below the gate electrode, the first drain regions being electrically connected to one another, the first source regions being electrically connected to one another;
a drain contact portion formed on the substrate to supply an electric current to the first drain regions;
a source contact portion formed on the substrate to connect the first source regions to a power supply; and
a terminal to connect with outside and an internal circuit,
wherein the fins, the gate insulating film, the gate electrode, the first drain regions and the first source regions constitute insulated-gate field-effect transistors respectively, and
a threshold voltage value of first one of the insulated-gate field-effect transistors is larger than that of second one of the other insulated-gate field-effect transistors, the second one of the insulated-gate field-effect transistors being more distant from the gate contact portion and the drain contact portion than the first one of the insulated-gate field-effect transistors,
wherein the gate contact portion and the drain contact portion are connected to the terminal, and
wherein the fins have the same height and length substantially.

7. The semiconductor device according to claim 6, wherein a width of first one of the fins is larger than that of second one of the fins, the first one of the fins constituting the first one of the insulated-gate field-effect transistors, the second one of the fins constituting the second one of the insulated-gate field-effect transistors.

8. The semiconductor device according to claim 6, wherein widths of a plurality of the fins are substantially same.

9. The semiconductor device according to claim 6, further comprising a second drain region and a second source region respectively formed on the substrate, and a drain contact electrode, wherein
the second drain region is connected to the first drain regions,
the second source region is connected to the first source regions, and
the drain contact electrode is formed on the second drain region on a side of the gate contact portion.

10. The semiconductor device according to claim 6, wherein plural ones of the fins and the other ones of the fins are disposed on both sides of the gate contact portion, respectively, and widths of ones of the fins closest to the gate contact portion are larger than widths of the other fins.

11. An ESD protection semiconductor device comprising:
a substrate;
fins formed on the substrate, the fins being a semiconductor layer, the fins being located separately from one another;
a gate insulating film formed on each side surface of the fins:
gate electrode portions formed on the gate insulating film, the gate electrode portions provided separately from one another so as to extend in substantially the same direction to cross over the fins;
a gate contact portion to supply the gate electrode portions with an electric signal;
first drain regions and first source regions formed in the respective fins, each of the first drain regions and the corresponding one of the first source regions being provided so as to sandwich each of portions of the fins located below the gate electrode portions, ones of the first source regions being electrically connected to each other, the ones of the first source regions being disposed on both end sides in an intersecting direction intersecting with the extending direction of the gate electrode portions;
a drain contact portion formed on the substrate to supply an electric current to the first drain regions;
a source contact portion formed on the substrate to connect the first source regions to a power supply; and
a terminal to connect with outside and an internal circuit,
wherein the fins, the gate insulating film, the gate electrode portions, the first drain regions and the first source regions constitute insulated-gate field-effect transistors respectively, the insulated-gate field-effect transistors being arranged in a matrix, and the insulated-gate field-effect transistors are composed of a plurality of groups, the groups arranged in the direction intersecting with the gate electrode portions, each of the groups including plural ones of the insulated-gate field-effect transistors being connected in series to one another, and widths of first ones of the fins is larger than those of second ones of the fins, the second ones of the fins being more distant from the gate contact portion and the drain contact portion than the first ones of the fins,
wherein the gate contact portion and the drain contact portion are connected to the terminal, and
wherein ones of the first drain regions and ones of the first source regions are alternately formed in the intersecting direction in each of the fins.

12. The semiconductor device according to claim 11, wherein the first source regions are electrically connected in common, and the first drain regions are electrically connected in common.

13. The semiconductor device according to claim 11, wherein
threshold voltage values of first ones of the insulated-gate field-effect transistors are greater than those of second ones of the other insulated-gate field-effect transistors, the first ones of the fins constituting the first ones of the insulated-gate field-effect transistors respectively, the second ones of the fins constituting the second ones of the insulated gate field-effect transistors respectively.

14. The semiconductor device according to claim 11, further comprising a second source region and a third source region formed on the substrate, wherein the second source region is connected with ones of the first source regions on one end side in the intersecting direction, and the third source region is connected with others of the first source regions on the other end side in the intersecting direction.

* * * * *